(12) United States Patent
Niederkorn et al.

(10) Patent No.: US 7,969,748 B2
(45) Date of Patent: Jun. 28, 2011

(54) EMI SHIELDING SLIDE ASSEMBLIES FOR SLIDABLY OPENING AND CLOSING PORTABLE ELECTRONIC DEVICES AND FOR PROVIDING EMI SHIELDING FOR BOARD-MOUNTED ELECTRONIC COMPONENTS

(75) Inventors: Reed Niederkorn, Saint Louis, MO (US); Torsten Ostervall, Stockholm (SE)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 12/906,754

(22) Filed: Oct. 18, 2010

(65) Prior Publication Data

US 2011/0032692 A1    Feb. 10, 2011

Related U.S. Application Data

(63) Continuation-in-part of application No. PCT/US2009/040930, filed on Apr. 17, 2009.

(60) Provisional application No. 61/045,936, filed on Apr. 17, 2008.

(51) Int. Cl.
*H05K 9/00* (2006.01)

(52) U.S. Cl. ................... 361/816; 361/818; 361/756
(58) Field of Classification Search .................. 361/800, 361/816, 818, 756, 727, 741, 686, 799; 174/35 R, 174/51, 250–254
See application file for complete search history.

(56) References Cited

U.S. PATENT DOCUMENTS

| 5,603,103 | A  | * | 2/1997 | Halttunen et al. | .......... | 455/575.1 |
| 6,195,267 | B1 | * | 2/2001 | MacDonald et al. | .......... | 361/800 |

(Continued)

FOREIGN PATENT DOCUMENTS

KR           319967           7/2003
(Continued)

OTHER PUBLICATIONS

International Search Report and Written Opinion from PCT/US2009/040930 (now published as WO 2009/129446) which is related to the instant application through a priority claim, dated Nov. 27, 2009, 12 pages.

*Primary Examiner* — Hung S Bui
(74) *Attorney, Agent, or Firm* — Harness, Dickey & Pierce, P.L.C.

(57) ABSTRACT

According to various aspects, exemplary embodiments are provided of slide assemblies for slidably opening and closing portable communications terminals, which also are configured to provide electromagnetic interference (EMI) shielding for electronic components of a substrate, such as board-mounted electronic components on a printed circuit board (PCB) of a cellular phone, etc. In one exemplary embodiment, a slide assembly generally includes first and second slide members slidably coupled so as to allow the first slide member to be slidably moved relative to the second slide member. EMI shielding structure is along at least one surface of at least one of the first and second slide members. The EMI shielding structure and the at least one of the first and second slide members are operable for cooperatively providing EMI shielding for one or more board-mounted electronic components of a substrate when disposed within the interior cooperatively defined by the EMI shielding structure, the at least one of the first and second slide members, and the substrate.

18 Claims, 10 Drawing Sheets

U.S. PATENT DOCUMENTS

| | | | |
|---|---|---|---|
| 6,348,654 B1 * | 2/2002 | Zhang et al. | 174/362 |
| 6,370,362 B1 | 4/2002 | Hansen et al. | |
| 6,618,271 B1 | 9/2003 | Erickson et al. | |
| 6,822,871 B2 | 11/2004 | Lee et al. | |
| 7,286,360 B2 * | 10/2007 | Sohn | 361/704 |
| 7,288,727 B1 * | 10/2007 | Garcia | 174/369 |
| 7,564,691 B2 * | 7/2009 | Kuwajima et al. | 361/728 |
| 7,671,836 B2 * | 3/2010 | Lehtonen | 345/156 |
| 7,843,705 B2 * | 11/2010 | Horng | 361/818 |
| 2003/0227759 A1 | 12/2003 | Haworth | |
| 2005/0086786 A1 | 4/2005 | Sosnowski | |
| 2005/0215298 A1 | 9/2005 | Lee | |
| 2007/0032278 A1 | 2/2007 | Lee et al. | |

FOREIGN PATENT DOCUMENTS

| | | |
|---|---|---|
| KR | 345703 | 3/2004 |
| KR | 2004-044213 | 5/2004 |
| WO | WO 2006/031078 | 3/2006 |
| WO | WO 2009/129446 | 10/2009 |
| WO | WO 2009/129447 | 10/2009 |

* cited by examiner

EMI SHIELDING SLIDE ASSEMBLIES FOR SLIDABLY OPENING AND CLOSING PORTABLE ELECTRONIC DEVICES AND FOR PROVIDING EMI SHIELDING FOR BOARD-MOUNTED ELECTRONIC COMPONENTS

CROSS-REFERENCE TO RELATED APPLICATIONS

This application is a continuation-in-part of International Application No. PCT/US2009/040930 (published as WO 2009/129446 on Oct. 22, 2009), which, in turn, claimed the benefit of U.S. Provisional Application No. 61/045,936 filed Apr. 17, 2008. The entire disclosure of each of the above applications is incorporated herein by reference in its entirety.

FIELD

The present disclosure generally relates to portable electronic devices, such as handheld wireless communications terminals. More specifically, the present disclosure relates to slide assemblies for slidably opening and closing portable electronic devices (e.g., cellular phones, etc.), which also are configured to provide electromagnetic interference (EMI) shielding for board-mounted electronic components on a printed circuit board (PCB).

BACKGROUND

This section provides background information related to the present disclosure which is not necessarily prior art.

Portable wireless communications terminals (e.g., cellular phones with built-in digital cameras, etc.) have become increasingly popular. With increasing popularity, the number of users and their particular preferences and tastes in regard to functionality and operation of the devices have also increased, such as different user preferences as to how the device is opened and closed. In response to user demand, different types of portable terminals have been developed, such as bar type, flip type, flip-up type, and folder type.

In addition, slider type terminals have also been introduced. Slider type terminals can be equipped with an LCD module display device having a similar size as the LCD module display device commonly provided with the folder type terminals. Slider mechanisms may help contribute to size reduction or miniaturization of portable terminals into which they are incorporated. Conventional slider type terminals include a sub-body or cover that may be slidably opened and closed on a main body.

As with other electronic equipment, the electronic components of cellular phone's PCB generate electromagnetic signals that may radiate to and interfere with other electronic components internal to or external to the cellular phone. This electromagnetic interference (EMI) can cause degradation of signals, thereby rendering the cellular phone or adjacent electronic equipment inefficient. To reduce the adverse effects of EMI, electrically conducting material is interposed between the electronic circuitry for absorbing and/or reflecting EMI energy. This shielding may take the form of a complete enclosure (e.g., a single-piece board level shielding (BLS) can or enclosure, two-piece BLS shield, etc.) which may be placed around the electronic components of the PCB that generate electromagnetic signals and/or that may be susceptible to electromagnetic signals. For example, electronic circuits or components of a printed circuit board of a slider-type cellular phone are often enclosed within the top cover or lid and sidewalls of a BLS can in order to localize EMI within its source and/or to insulate the PCB electronic circuits or components from external EMI sources. Typically, the BLS can is a separately manufactured single-piece component that is separately installed between the PCB and the slide assembly. For example, the BLS can is typically mounted (e.g., soldered, etc.) to the PCB before the PCB is attached to the slider mechanism. After installation of the BLS can, the PCB may then be attached to the slider mechanism.

As used herein, the term electromagnetic interference (EMI) should be considered to generally include and refer to both electromagnetic interference (EMI) and radio frequency interference (RFI) emissions. The term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a shielding device in which electronic equipment is disposed.

SUMMARY

This section provides a general summary of the disclosure, and is not a comprehensive disclosure of its full scope or all of its features.

According to various aspects, exemplary embodiments are provided of slide assemblies for slidably opening and closing portable communications terminals, which also are configured to provide electromagnetic interference (EMI) shielding for electronic components of a substrate. In one exemplary embodiment, a slide assembly generally includes first and second slide members slidably coupled so as to allow the first slide member to be slidably moved relative to the second slide member. EMI shielding structure is along at least one surface of at least one of the first and second slide members. The EMI shielding structure and the at least one of the first and second slide members are operable for cooperatively providing EMI shielding for one or more board-mounted electronic components of a substrate when disposed within the interior cooperatively defined by the EMI shielding structure, the at least one of the first and second slide members, and the substrate.

In another exemplary embodiment, a portable communications terminal includes a slide assembly having first and second slide members slidably coupled so as to allow the first slide member to be slidably moved relative to the second slide member. A printed circuit board includes one or more electronic components mounted thereon. One or more EMI shielding walls are attached to at least one surface of at least one of the first and second slide members. A corresponding portion of the at least one of the first and second slide members that resides within a perimeter defined by the one or more EMI shielding walls is operable as an EMI shielding lid. Accordingly, the one or more EMI shielding walls and the corresponding portion of the at least one of the first and second slide members are operable for cooperatively providing EMI shielding for the electronic components disposed within the interior cooperatively defined by the one or more EMI shielding walls, the corresponding portion of the at least one of the first and second slide members, and the printed circuit board.

Other exemplary embodiments provide methods for providing EMI shielding for one or more electronic components of a printed circuit board of a portable communications terminal. The portable communications terminal may include first and second slide members slidably coupled so as to allow the first slide member to be slidably moved relative to the second slide member, and a printed circuit board having one or more electronic components mounted thereon. In an exemplary embodiment, a method generally includes attaching EMI shielding structure to at least one surface of at least one of the first and second slide members such that the EMI shielding structure and the at least one of the first and second slide members are operable for cooperatively providing EMI shielding for the electronic components that are disposed within the interior cooperatively defined by the EMI shielding structure, the at least one of the first and second slide members, and the printed circuit board.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 8:
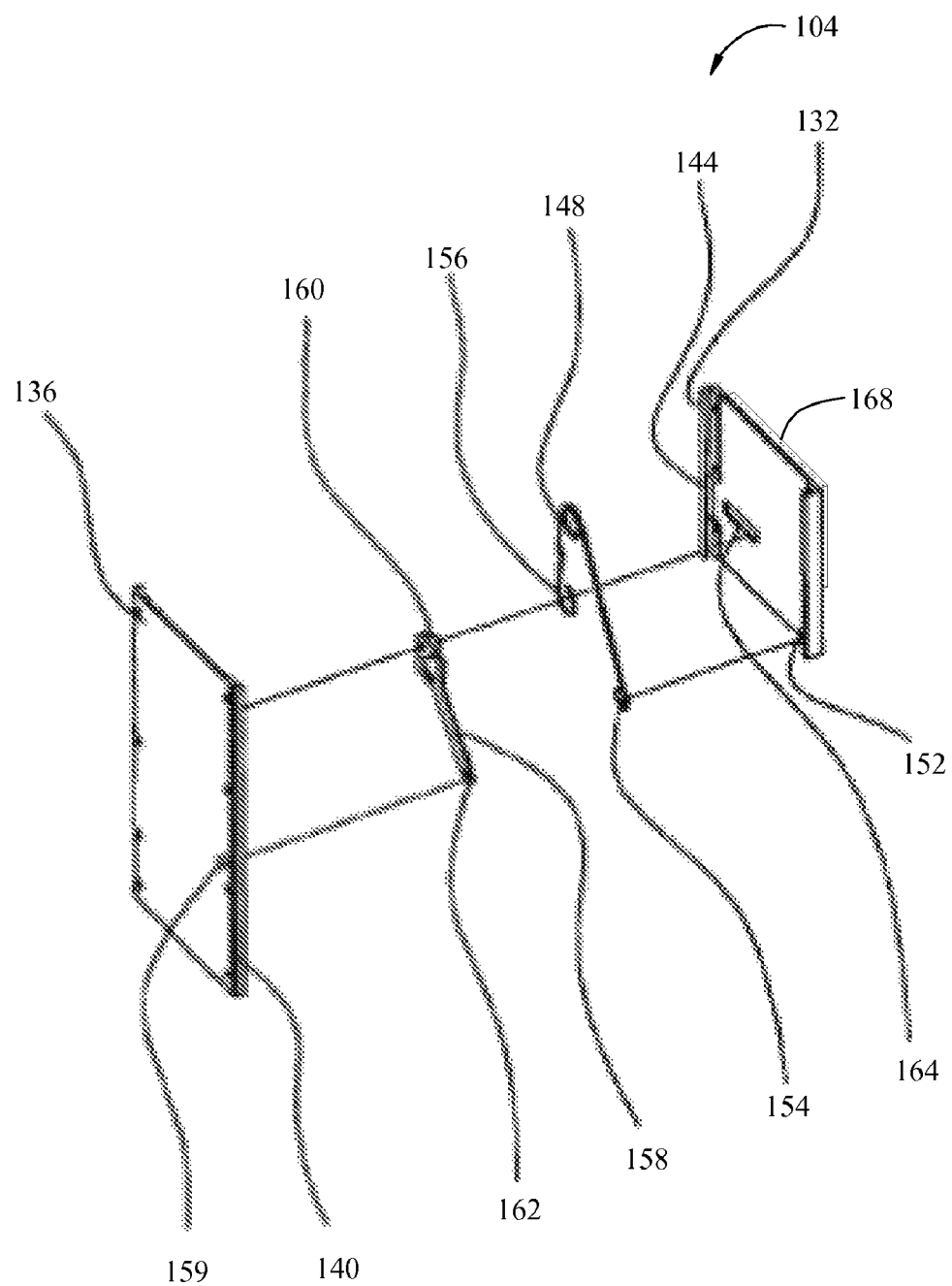
FIG. 8 is an exploded perspective view of the slide assembly shown in FIG. 7.
Figure 9:
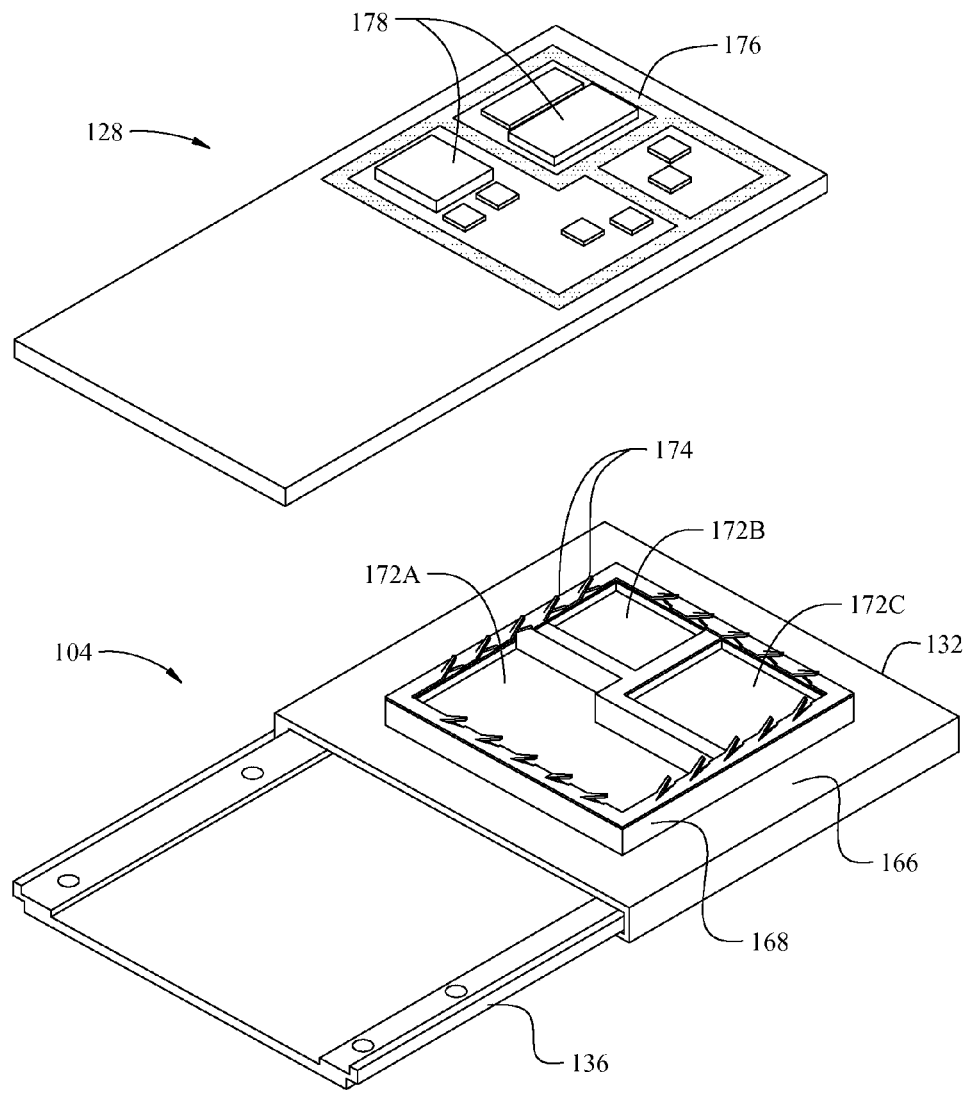
Figure 10:
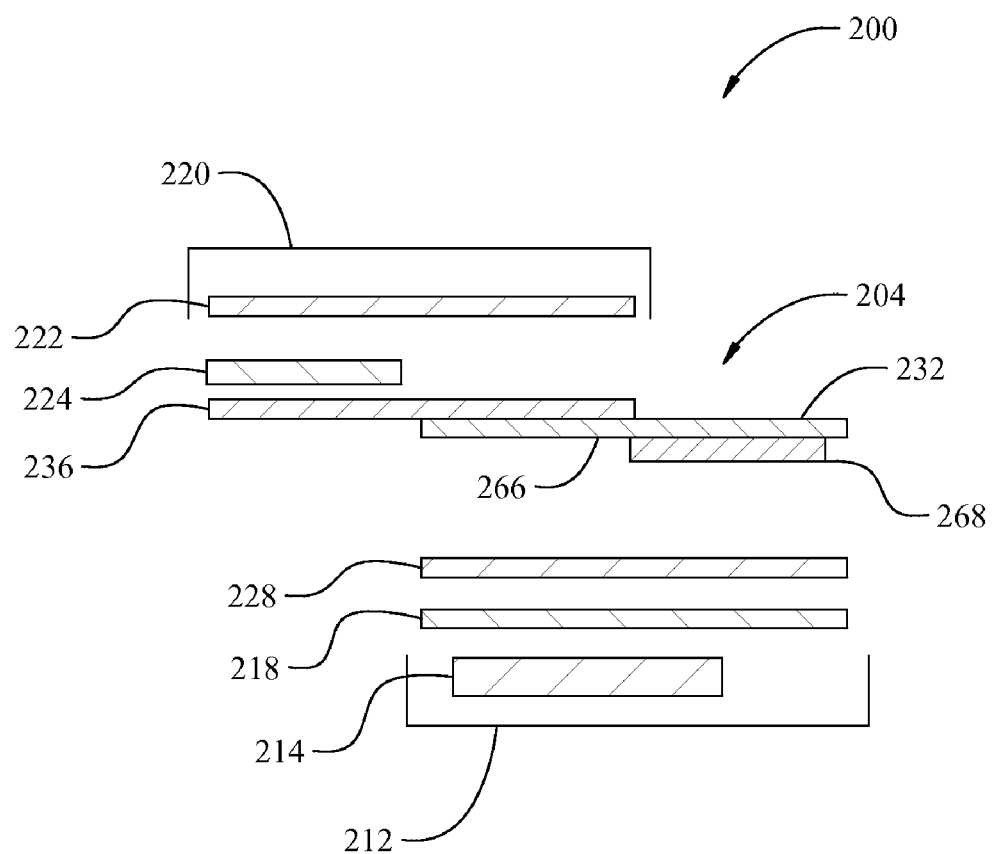

FIG. 9 is a perspective view of the slide assembly shown in FIG. 8 after being assembled, and further illustrating EMI shielding walls thereon and a printed circuit board having electronic components thereon, wherein the EMI shielding walls are arranged to correspond to the layout of the PCB electronic components; and FIG. 10 is a simplified schematic of a portable communications terminal having an EMI shielding slide assembly for slidably opening and closing the portable communications terminal and for providing EMI shielding for board-mounted electronic components on a printed circuit board (PCB), according to an exemplary embodiment of the present disclosure.

Corresponding reference numerals indicate corresponding parts throughout the several views of the drawings.

DETAILED DESCRIPTION

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

According to various aspects, exemplary embodiments are provided of slide assemblies for slidably opening and closing portable communications terminals, which also are configured to provide electromagnetic interference (EMI) shielding for board-mounted electronic components on a printed circuit board (PCB). In one exemplary embodiment, a slide assembly includes first and second slide members slidably coupled so as to allow the first slide member to be slidably moved relative to the second slide member. EMI shielding structure (e.g., walls, etc.) is disposed (e.g., attached to, welded to, etc.) along at least one surface of at least one of the slide members (e.g., lower surface of second slide member, etc.), such that the EMI shielding structure and slide member are operable for cooperatively providing EMI shielding for board-mounted electronic components of a printed circuit board, when the board-mounted electronic components are disposed within the interior cooperatively defined by the EMI shielding structure, the slide member, and the printed circuit board.

According to various aspects, exemplary embodiments are provided of slide assemblies for slidably opening and closing portable communications terminals, which also are configured to provide electromagnetic interference (EMI) shielding for electronic components of a substrate. In one exemplary embodiment, a slide assembly generally includes first and second slide members slidably coupled so as to allow the first slide member to be slidably moved relative to the second slide member. EMI shielding structure is along at least one surface of at least one of the first and second slide members. The EMI shielding structure and the at least one of the first and second slide members are operable for cooperatively providing EMI shielding for one or more board-mounted electronic components of a substrate when disposed within the interior cooperatively defined by the EMI shielding structure, the at least one of the first and second slide members, and the substrate.

In another exemplary embodiment, a portable communications terminal includes a slide assembly having first and second slide members slidably coupled so as to allow the first slide member to be slidably moved relative to the second slide member. A printed circuit board includes one or more electronic components mounted thereon. One or more EMI shielding walls are attached to at least one surface of at least one of the first and second slide members. A corresponding portion of the at least one of the first and second slide members that resides within a perimeter defined by the one or more EMI shielding walls is operable as an EMI shielding lid. Accordingly, the one or more EMI shielding walls and the corresponding portion of the at least one of the first and second slide members are operable for cooperatively providing EMI shielding for the electronic components disposed within the interior cooperatively defined by the one or more EMI shielding walls, the corresponding portion of the at least one of the first and second slide members, and the printed circuit board.

Other exemplary embodiments provide methods for providing EMI shielding for one or more electronic components of a printed circuit board of a portable communications terminal. The portable communications terminal may include first and second slide members slidably coupled so as to allow the first slide member to be slidably moved relative to the second slide member, and a printed circuit board having one or more electronic components mounted thereon. In an exemplary embodiment, a method generally includes attaching EMI shielding structure to at least one surface of at least one of the first and second slide members such that the EMI shielding structure and the at least one of the first and second slide members are operable for cooperatively providing EMI shielding for the electronic components that are disposed within the interior cooperatively defined by the EMI shielding structure, the at least one of the first and second slide members, and the printed circuit board.

As recognized by the inventors hereof, total costs and size may be reduced for portable communications terminals (e.g., slider type terminals, etc.) by attaching (e.g., welding, etc.) EMI shielding walls directly to the slide assembly, instead of using a separate BLS shielding enclosure or can that is mounted (e.g., soldered, etc.) directly to the PCB. In exemplary embodiments disclosed herein, one or more EMI shielding walls having spring fingers (e.g., fingerstock gaskets, etc.) are attached to a portion of a slide assembly. A PCB with electronic components may then be mounted to or installed/positioned adjacent to the slide assembly such that the PCB's electronic components are generally enclosed within the interior cooperatively defined by the EMI shielding walls and corresponding surface or portion of the slide assembly. Accordingly, the corresponding surface of portion of the slider assembly that resides within the perimeter defined by the EMI shielding walls may thus operate or function as a EMI shielding lid or cover for the EMI shielding walls.

With the slide assembly made of a suitable EMI shielding material (e.g., stainless steel, etc.), the slide assembly and EMI shielding walls attached thereto cooperate to provide EMI shielding for board-mounted electronic components that are disposed or enclosed within the interior cooperatively defined by the PCB, EMI shielding walls, and the portion of the slide assembly disposed over the electronic components. The inventors hereof have recognized that by providing EMI shielding in this exemplary manner, the overall size or height of the portable communications terminal may be reduced (e.g., up to about 0.5 millimeter height reduction, etc.) because there is no longer the need to provide extra room or tolerance between the slide assembly and a board-mounted BLS shielding enclosure/can, as the EMI shielding walls may be attached (e.g., soldered, etc.) directly to the slide assembly. In addition, the inventors have also recognized that manufacturing costs may also be reduced as the EMI shielding walls are less costly than soldered/board-mounted BLS shielding enclosures/cans.

Figure 1:
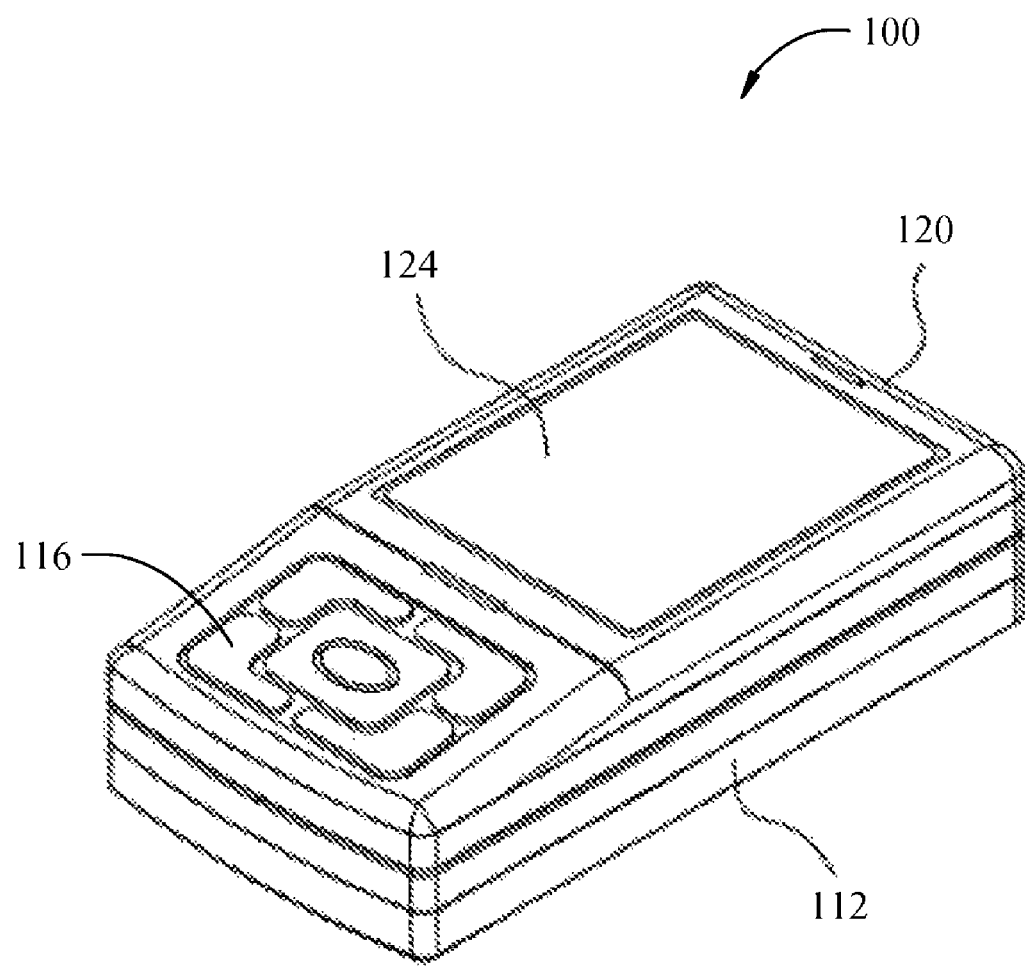
FIG. 1 is a perspective view showing a portable communications terminal in a closed state, according to an exemplary embodiment of the present disclosure.
Figure 2:
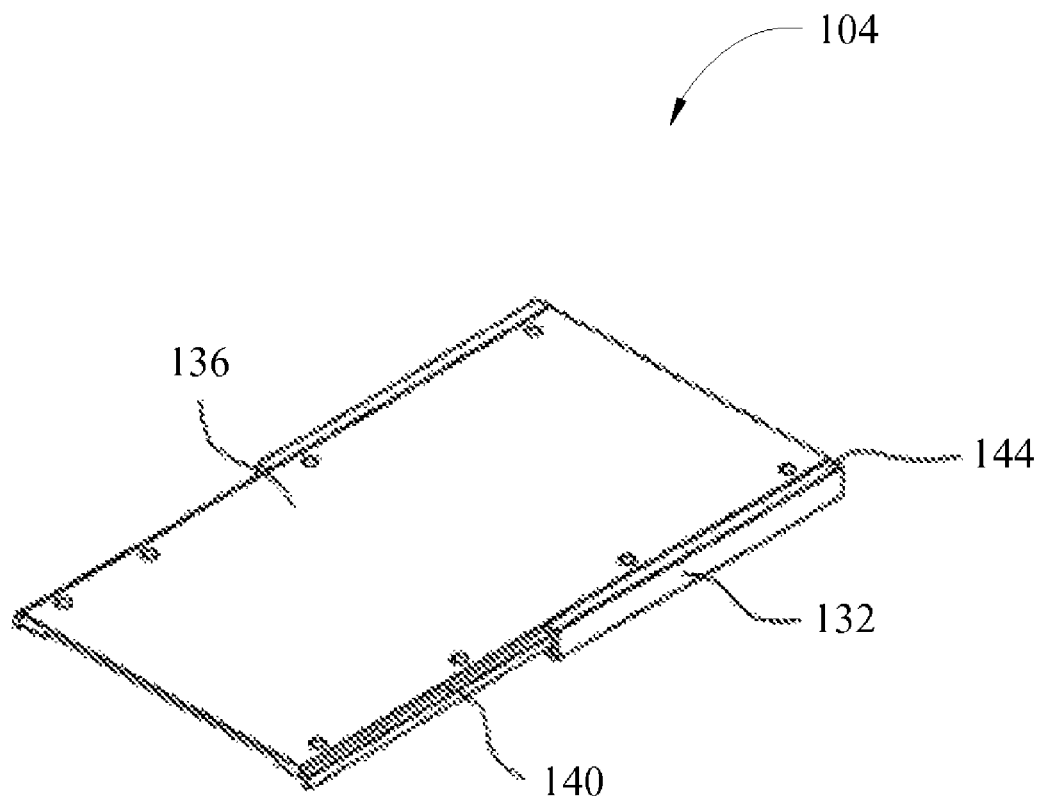
FIG. 2 is an upper perspective view of a slide assembly (in a closed state), which may be used in a portable communications terminal such as shown in FIG. 1.
Figure 3:
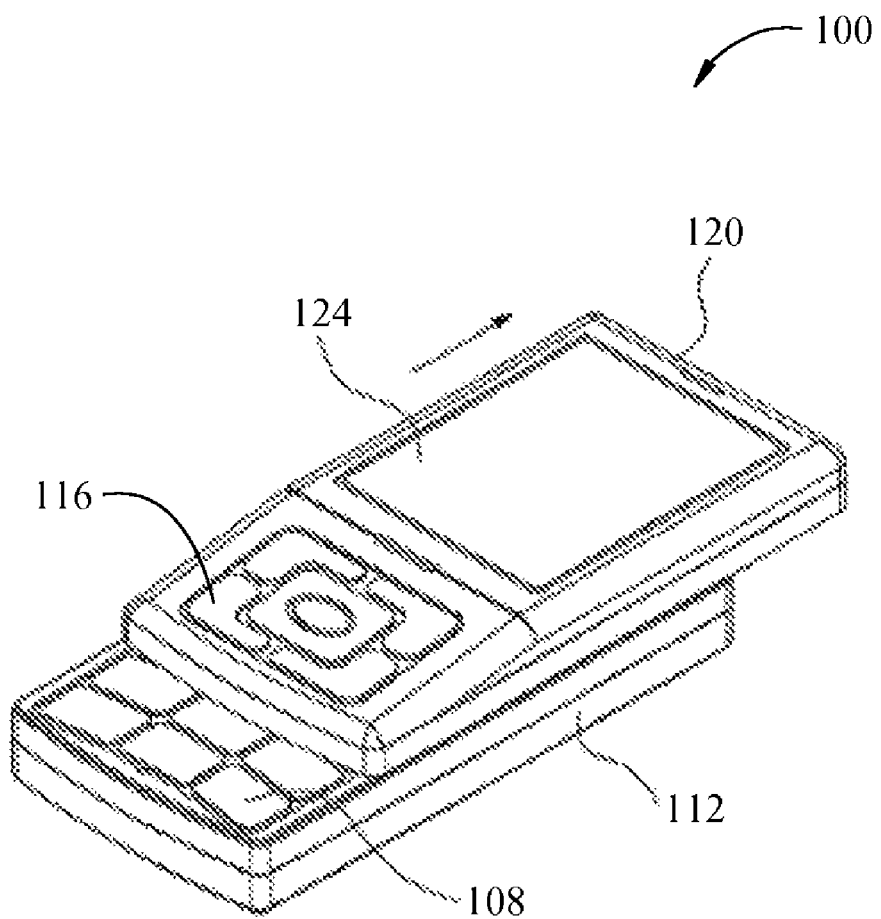
FIG. 3 is an perspective view of the portable communications terminal shown in FIG. 1 in a partially open state.
Figure 4:
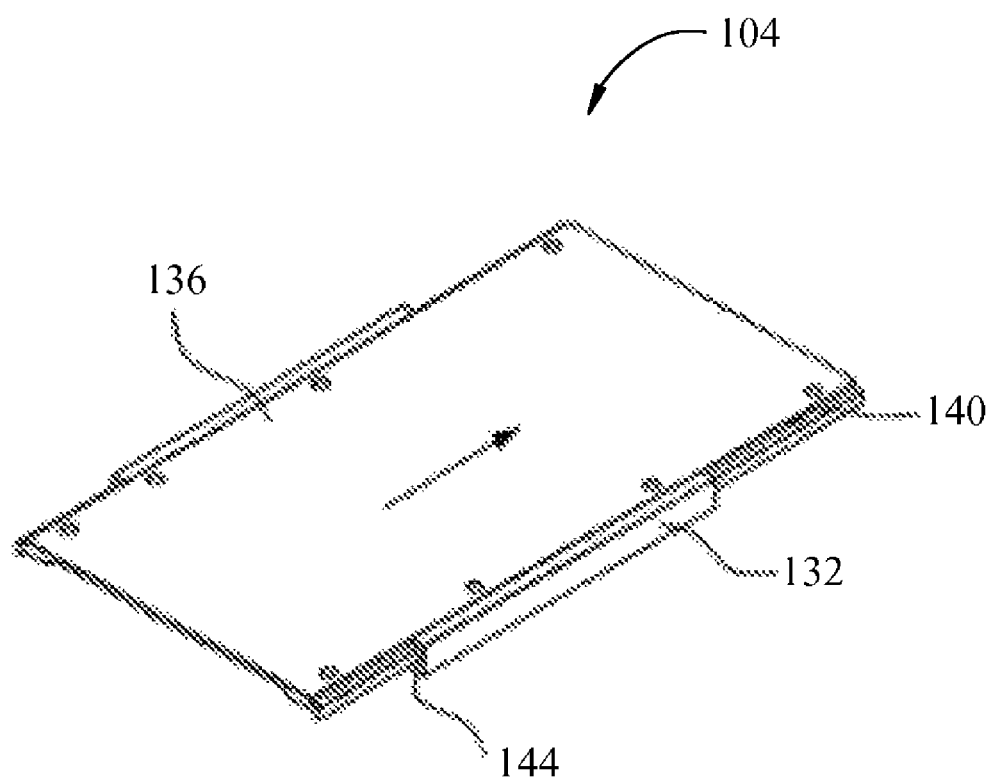
FIG. 4 is an upper perspective view of the slide assembly shown in FIG. 2 in a partially open state.
Figure 5:
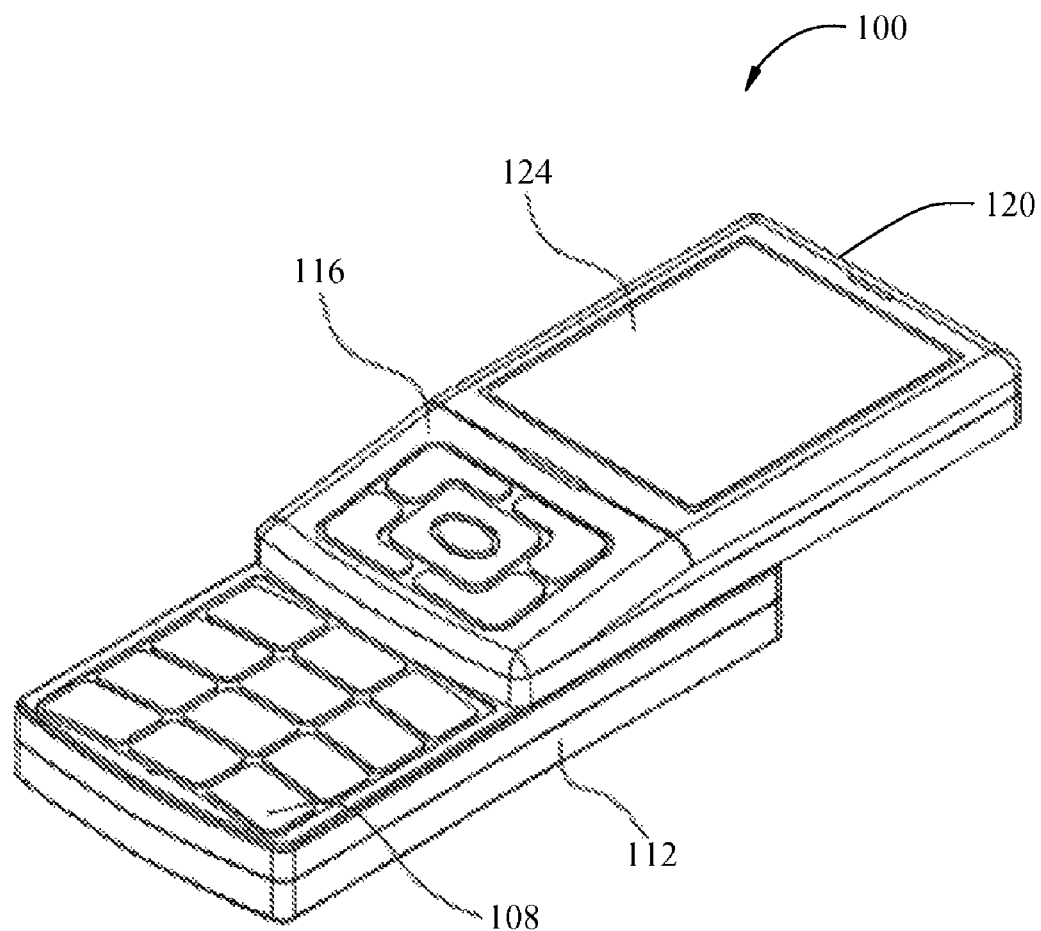
FIG. 5 is a perspective view of the portable communications terminal shown in FIG. 1 in an open state.
Figure 6:
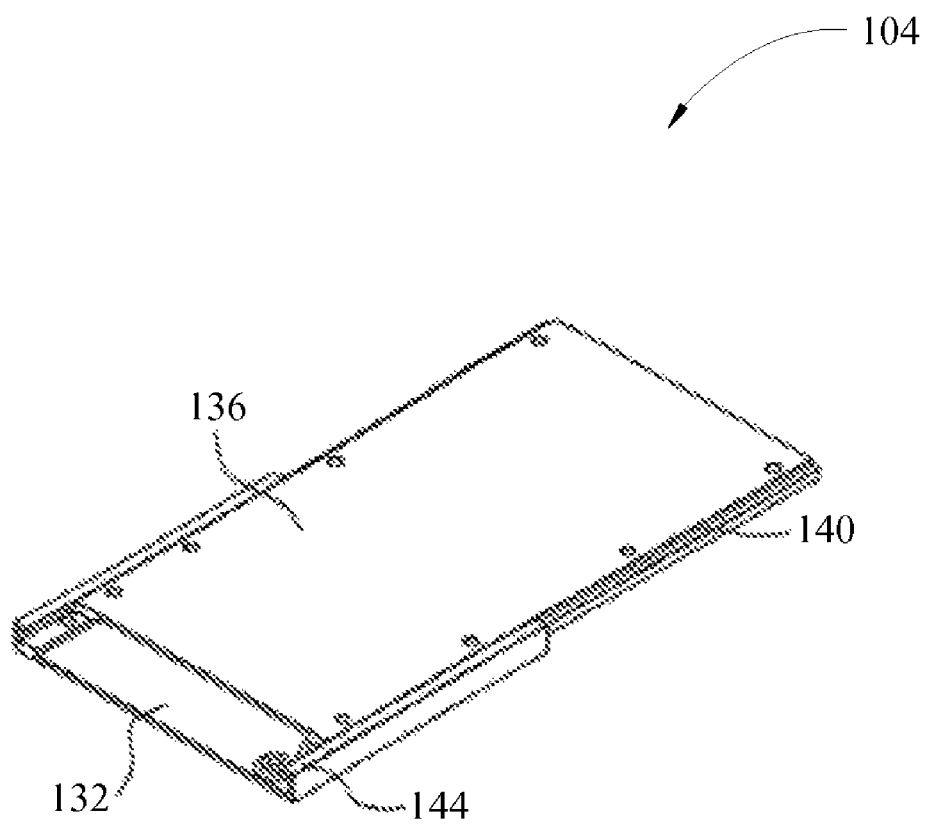
FIG. 6 is an upper perspective view of the slide assembly shown in FIG. 2 in an open state.

With reference now to the figures, FIGS. 1, 3, and 5 respectively illustrate an exemplary portable communications terminal 100 in a closed state (FIG. 1), a partially opened state (FIG. 3), and an opened state (FIG. 5). FIGS. 2, 4, 6, 7, 8, and 9 illustrate an exemplary embodiment of an EMI shielding slide assembly 104, which may be used in the portable communications terminal 100. More specifically, FIG. 2 shows the EMI shielding slide assembly 104 in a closed state. FIG. 4 shows the EMI shielding slide assembly 104 in a partially opened state. FIG. 6 shows the EMI shielding slide assembly 104 in an opened state.

In this exemplary embodiment, the portable communication terminal 100 includes a keypad 108 (FIGS. 3 and 5) supported by or placed on a lower body 112. A second keypad 116 (FIGS. 1, 3, and 5) is supported by or placed on an upper body 120. A display 124 (e.g., liquid crystal display screen, etc.) is supported by or placed on the upper body 120. The first and second keypads 108, 116 and display 124 are electrically connected to a PCB 128 (FIG. 7), which is at least partially installed or housed within the lower body 112. Accordingly, the keypads 108, 116 and display 124 allow a user to interface with the portable communications terminals 100 for carrying out various functions of the portable communications terminal 100. Embodiments of the present disclosure may include or be used with a wide variety of portable terminals, including such portable communications terminals or devices like cellular phones, personal digital assistants (PDAs), other electronic devices, flip-type portable communications terminals, sliding-type portable communications terminals, rotating-type portable communications terminals, portable communications terminals that are not configured to be opened and closed, etc. within the scope of the present disclosure.

As shown by FIGS. 1, 3, and 5, sliding the upper body 120 relative to the lower body 112 (to thereby open the portable communications terminal 100) exposes and makes the keypad 108 accessible to a user. Accordingly, the portable communications terminal 100 can be moved to an open position by sliding the upper body 120 slider body upwardly or downwardly relative to the lower body 112. For example, the user may choose to move the upper body 120 while holding the lower body 112 stationary (or vice versa) to accomplish the opening and closing of the terminal. Or the user may move both the upper and lower bodies 120, 112 relative to each other to open and close the terminal. Accordingly, the particular manner and variations by which a user chooses to open and close a terminal should not be viewed as limitations to the scope of the present disclosure.

The portable communications terminal 100 may be configured such that the LCD display 124 turns on when the portable communications terminal 100 is opened by sliding the upper body 120 relative to the lower body 112 and/or when a user presses any key of the keypad 108 and/or 116. When the upper body 120 is slidably moved in the opposite direction relative to the lower body 112 to close the portable communications terminal 100, the LCD display 124 may be configured to turn off. Alternatively, or additionally, the user may be able to turn off the LCD display 124 by pressing an "off" key of the keypad 108 and/or 116. Accordingly, the particular manner and variations by which the LCD is turned off and on should not be viewed as limitations to the scope of the present disclosure.

Figure 7:
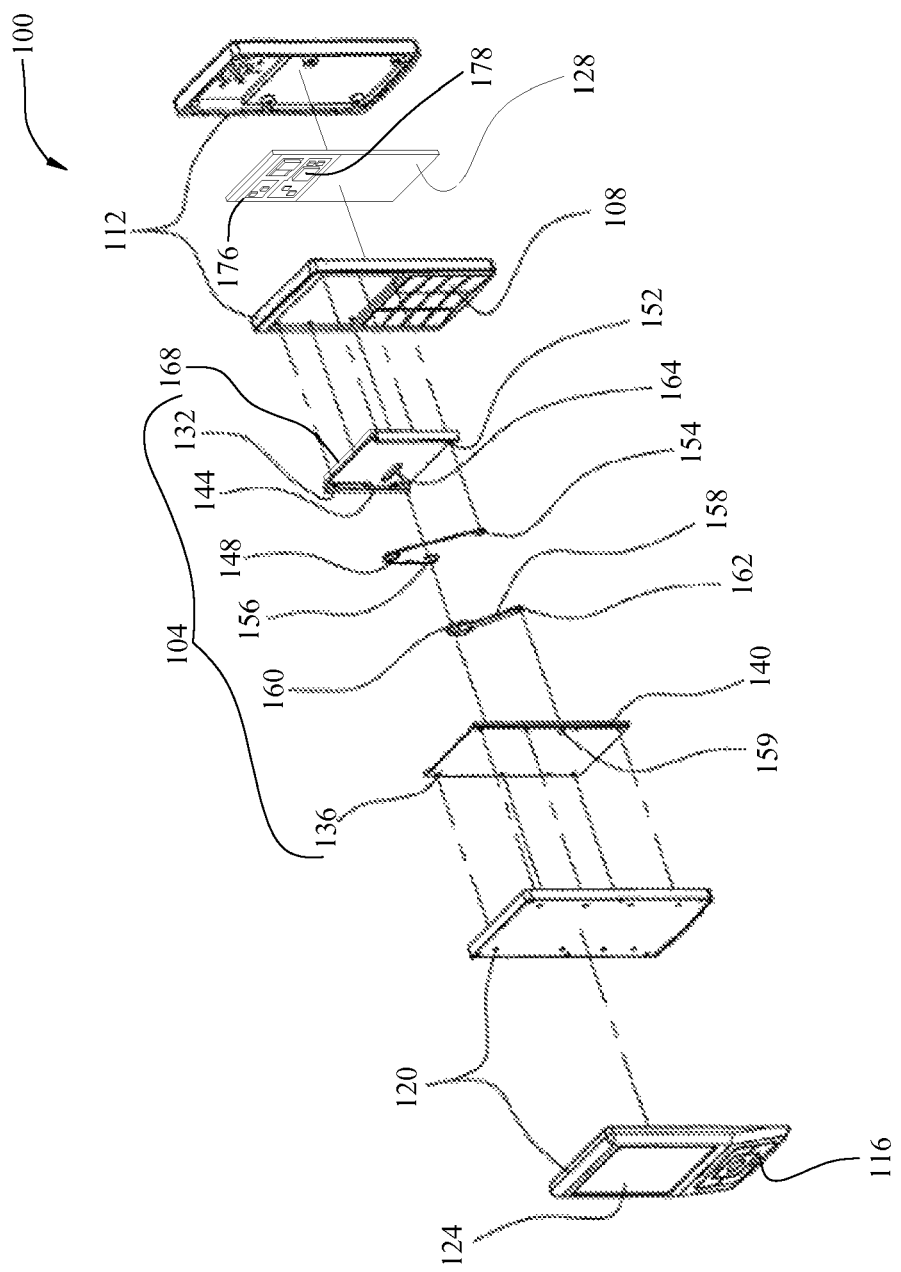
FIG. 7 is an exploded perspective view of the portable communications terminal shown in FIG. 1.

With further reference to FIG. 7, a slide plate, body or member 132 is coupled to the lower body 112, such as by mechanical fasteners, etc. A slide plate, body, or member 136 is coupled to the upper body 120, such as by mechanical fasteners, etc. The slide plates 132 and 136 are slidably engaged, such that the plates 132, 136 are slidable back-and-forth along, against, or relative to each other.

The slide plate 136 includes a guide slit 140 (e.g., integrally formed into the slide plate 136, etc.). The slide plate 132 includes a guide rib 144 (e.g., integrally formed in the slide plate 132, etc.). The guide rib 144 and guide slit 140 are configured such that the movement is slidable along a designated path. A biasing device is supported by the plate 132. In the illustrated embodiment, the biasing device is a torsion spring 148. One end portion of the torsion spring 148 is fixed to the plate 132. The other end portion of the torsion spring 148 is free and generates an elasticity power attracted toward the fixed end.

The plate 132 includes a first boss 152 (e.g., integrally formed in the plate 132, etc.). The torsion spring 148 includes a first ring part 154 (e.g., integrally formed at the fixed end portion of the torsion spring 148, etc.). The fist ring part 154 is coupled to the first boss 152. The torsion spring 148 also includes a second ring part 156 at its free end (e.g., integrally formed at the free end, etc.).

A power transformation member is coupled to the slide plate 136 and to the torsion spring 148. The power transformation member receives the elasticity power of the torsion spring 148 to supply the elasticity power in the direction of closing the slide plate 136 towards the closed position of the slide plate 136 based on a designated spot on the moving path of the slide plate 136, an also to supply the elasticity power in the direction of opening the slide plate 136 towards the open position of the slide plate 136 based on the same.

As shown in FIG. 7, the power transformation member includes a rotating arm 158 of which one end portion is connected to the torsion spring 148 and guided onto the plate 132 so that it can flow only in a perpendicular direction to the moving direction of the slide plate 136. The other end portion of the rotating arm 158 is rotatably connected to the slide plate 136 to be rotatable.

A guide pin 160 is at one end portion of the rotating arm 158. The guide pin 160 is coupled to be rotatable to the second ring part 156 of the torsion spring 148. A rotating hole 162 is at the other end portion of the rotating arm 158. A boss 159 on the slide plate 136 is coupled to be rotatable to the rotating hole 162 of the rotating arm 158.

A guide member guides a connecting part between the biasing device and the power transformation member to move in a direction of being applied with an elasticity power of the elastic member, and generates a damping force against the power transformation member not to move the slide plate 136 any more in the direction of closing the slide plate 136 into the plate 132 when the upper body 120 is closed into the lower body 112, and not to move the slide plate 136 any more in the direction of opening the upper body 120 from the lower body 112 when the slide plate 136 is opened from the plate 132. In the illustrated embodiment, the guide member includes an elongated hole 164, which guides the guide pin 160 to move the connecting part between the torsion spring 148 and the power transformation member 158 only in a direction where the torsion spring 148 applies an elastic force. The elongated hole 164 is formed lengthwise to be perpendicular to the sliding direction of the slide plate 136. Additional details concerning opening and closing operations of a slide assembly that may be used with embodiments of the present disclosure may be found in U.S. Patent Application Publication 2007/0032278, which is incorporated herein by reference in its entirety.

With reference now to FIG. 9, the slide assembly 104 may be provided with one or more EMI shielding walls 168 for providing EMI shielding to electronic components 178 on the PCB 128. In the illustrated embodiment, EMI shielding walls 168 are disposed along the bottom surface 166 of the lower slide plate 132. The EMI shielding walls 168 are configured (e.g., sized, located, shaped, etc.) to define a plurality of individual EMI shielding compartments 172A, 172B, 172C that correspond to the layout of the PCB electronic components 178. Accordingly, the PCB electronic components 178 will thus be positioned in different compartments defined by the EMI shielding walls 168 and the slide plate 132 such that the PCB electronic components 178 are provided with EMI shielding by virtue of the EMI shielding compartments inhibiting the ingress and/or egress of EMI into and/or out of each EMI shielding compartment.

The EMI shielding walls 168 are illustrated as being monolithically formed as a single component structure. For example, the EMI shielding walls 168 may be formed by drawing (e.g., over a die, etc.), bending, stamping, folding, etc. Alternative embodiments may include a plurality of separate EMI shielding wall pieces that are separately attached (e.g., welded, etc.) to the bottom surface 166 of the slide plate 132 to define one or more EMI shielding compartments.

The EMI shielding walls 168 may be configured (e.g., sized, shaped, constructed, etc.) to be installed (e.g., surface mounted, secured, etc.) to the bottom surface 166 of the slide plate 132 by any acceptable means such as welding, soldering, mechanical fastening, etc. In the illustrated embodiment, the EMI shielding walls 168 are welded to the slide plate 132.

The EMI shielding walls 168 may be formed from various materials, such as electrically-conductive materials like cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the EMI shielding walls 168 may be formed from a plastic material coated with electrically-conductive material.

With continued reference to FIG. 9, the EMI shielding walls 168 include resilient spring fingers 174. The spring fingers 174 may be configured for contacting electrically-conductive surfaces 176 (as represented by the speckled portions 176) (e.g., ground traces, etc.) of the PCB 128, to provide an electrical grounding pathway or connection between the slide plate 132 and the PCB 128. A wide range of materials may be used for the EMI shielding walls 168 and fingers 174, preferably electrically-conductive materials having sufficient resiliency or springiness for permitting the spring fingers 174 to be at least partially deflected in the final installed position or assembly. For example, this resiliency may allow the spring fingers 174 to deflect or flex, and then to respond with a sufficient restorative force for biasing the spring fingers 174 against the electrically-conductive surfaces 176 of the PCB 128. This biasing force may help the spring fingers 174 maintain good electrical contact with the PCB 128. In some exemplary embodiments, EMI shielding walls may include formed finger gaskets (e.g., formed by bending, stamping, folding, etc.) made from beryllium copper alloys or other suitable electrically-conductive materials.

In addition, a compressive clamping force may be generated when the various components of the portable communications terminal 100 are assembled. For example, assembly (e.g., mechanical fastening, etc.) of the lower slide plate or body 132 to the PCB 128 may generate a compressive clamping force such that the EMI shielding walls 168 are compressively sandwiched between the PCB 128 and slide body 132. This compressive clamping force may compress the spring fingers 174 against electrically-conductive surfaces 176 (e.g., ground traces, etc.) on the PCB 128, to help establish good electrical conductivity therebetween that is sufficient for EMI shielding performance.

FIG. 10 illustrates a portable communications terminal 200 according to another exemplary embodiment. As shown in FIG. 10, the portable communication terminal 200 includes a back cover or housing portion 212 and a front cover or housing portion 220. Also shown in FIG. 10 is a battery 214 and an internal frame, middle deck, or support 218. The middle deck 218 may be used to support an antenna, among other components. A front internal frame or user interface support 222 is disposed behind the front cover 220. The user interface support 222 may be used to support one or more user interface components, such as keypads, a display device 224 (e.g., LCD display, etc.), etc. The user interface support 222 may include a window or opening through which the display device 224 is externally visible.

With continued reference to FIG. 10, a slide assembly 204 is shown in an opened state. The slide assembly 204 includes a lower slide body, member, or plate 232 and an upper slide body, member, or plate 236. The slide bodies 232, 236 are slidably coupled to each other such that the bodies 232, 236 are slidable back-and-forth along, against, or relative to each other.

The portable communications terminal 200 may be configured such that the LCD display 224 turns on when the portable communications terminal 200 is opened by sliding the upper slide body 236 (and components 220, 222, 224 coupled for common movement therewith) relative to the lower slide body 232 (and components 212, 214, 218, 228 coupled for common movement therewith). When the upper slide body 236 is slidably moved in the opposite direction relative to the lower slide body 232 to close the portable communications terminal 200, the LCD display 224 turns off. By way of example, the upper slide body 236 may be slid while the lower slide body 232 is held stationary in order to open or close the portable communications terminal 200. But the user may also choose to move the lower slide body 232 relatively away from the upper slide body 236 while holding the upper slide body 236 stationary to accomplish the opening and closing of the portable communications terminal 200. Or, the user may move both the upper and lower slide bodies 232, 236 relative to each other to open and close the portable communications terminal 200. Accordingly, the particular manner and variations by which a user chooses to open and close the portable communications terminal 200 should not be viewed as limitations to the scope of the present disclosure.

EMI shielding structure 268 (e.g., one or more EMI shielding walls, fingerstock gaskets, spring fingers, combinations thereof, etc.) are disposed along a lower surface 266 of the lower slide body 232. The one or more EMI shielding components 268 are configured (e.g., shaped, sized, arranged, electrically-conductive, etc.) for providing EMI shielding to electronic components on the PCB 228. The EMI shielding structure 268 may define a plurality of individual EMI shielding compartments that correspond to the layout of the PCB electronic components. Accordingly, the PCB electronic components will thus be positioned in different compartments defined by the EMI shielding structure and the slide plate 232 such that the PCB electronic components are provided with EMI shielding by virtue of the EMI shielding compartments inhibiting the ingress and/or egress of EMI into and/or out of each EMI shielding compartment.

The EMI shielding structure 268 may be monolithically formed as a single component structure. For example, the EMI shielding structure 268 may be formed by drawing (e.g., over a die, etc.), bending, stamping, folding, etc. Alternative embodiments may include a plurality of separate EMI shielding pieces that are separately attached (e.g., welded, etc.) to the bottom surface 266 of the slide plate 232 to define one or more EMI shielding compartments.

The EMI shielding structure 268 may be configured (e.g., sized, shaped, constructed, etc.) to be installed (e.g., surface mounted, secured, etc.) to the bottom surface 266 of the slide plate 232 by any acceptable means such as soldering, mechanical fastening, etc.

FIGS. 1 through 10 illustrate exemplary embodiments of slide assemblies and portable communications terminals in which aspects of the present disclosure may be incorporated. Aspects of the present disclosure, however, should not be limited solely to these particular slide assemblies and cellular phones. For example, aspects of the present disclosure may be incorporated into portable communications terminals that include rotatable and slidable bodies. As another example, aspects of the present disclosure may be incorporated into any one or more of the various slide assemblies disclosed in U.S. Patent Application Publication 2007/0032278, which is incorporated herein by reference. For example, one or more EMI shielding walls (e.g., walls 168 with spring fingers 174, one or more EMI shielding fingerstock pieces, etc.) may be provided (e.g., welded, etc.) to any or more of the sliding opening and closing devices shown in FIGS. 1-7, FIGS. 8-11, FIGS. 12-17, FIGS. 18-21, FIGS. 22-25, FIGS. 26-29, FIGS. 30-36, FIGS. 37-43, and/or FIGS. 44-48 of U.S. Patent Application Publication 2007/0032278.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A slide assembly for slidably opening and closing an electronic device and for providing EMI shielding to one or more electronic components on a substrate, the slide assembly comprising:
   first and second slide members slidably coupled so as to allow the first slide member to be slidably moved relative to the second slide member;
   EMI shielding structure along at least one surface of at least one of the first and second slide members;
   wherein a corresponding portion of the at least one of the first and second slide members that resides within a perimeter defined by the EMI shielding structure covers the EMI shielding structure and is operable as an EMI shielding lid for the EMI shielding structure;
   whereby the EMI shielding structure and the corresponding portion of the at least one of the first and second slide members are operable for cooperatively providing EMI shielding for one or more board-mounted electronic components of a substrate when disposed within the interior cooperatively defined by the EMI shielding structure, the at least one of the first and second slide members, and the substrate.

2. The slide assembly of claim 1, wherein the EMI shielding structure comprises at least one resilient finger extending generally outwardly from the EMI shielding structure, for electrically contacting at least one electrically conductive surface of the substrate.

3. The slide assembly of claim 1, wherein:
   the EMI shielding structure includes one or more EMI shielding walls attached to a surface of the second slide member; and/or the EMI shielding structure includes one or more EMI shielding walls welded directly to the surface of the second slide member.

4. The slide assembly of claim 1, wherein:
   the EMI shielding structure includes one or more EMI shielding walls having resilient spring fingers and that are attached to a surface of the second slide member; and/or
   the EMI shielding structure includes one or more EMI shielding walls having resilient spring fingers and that are welded directly to the surface of the second slide member.

5. The slide assembly of claim 1, wherein the EMI shielding structure and the corresponding portion of the at least one of the first and second slide members cooperatively define two or more EMI shielding compartments corresponding to the layout of the electronic components of the substrate, such that electronic components are in different EMI shielding compartments.

6. The slide assembly of claim 1, wherein
   the EMI shielding structure is monolithically formed as a single component Structure.

7. The slide assembly of claim 1, wherein the EMI shielding structure includes one or more spring fingers configured for contacting one or more electrically-conductive surfaces of the substrate.

8. The slide assembly of claim 7, wherein the one or more spring fingers are formed from electrically-conductive material having sufficient resiliency for permitting the one or more spring fingers to be at least partially deflected and then to respond with a sufficient restorative force for biasing the one or more spring fingers against the one or more electrically-conductive surfaces of the substrate, for maintaining good electrical contact with the one or more electrically-conductive surfaces of the substrate.

9. The slide assembly of claim 1, wherein:
   the first slide member comprises a first slide plate;
   the second slide member comprises a second slide plate; and
   the corresponding portion of the at least one of the first and second slide members comprises a surface of the first or second plate member disposed over the EMI shielding structure and thereby operable as the EMI shielding lid for the EMI shielding structure.

10. A portable communications terminal including the slide assembly of claim 9, a lower body supporting a first user interface component and coupled to the first slide plate, and an upper body supporting a second user interface component and coupled to the second slide plate.

11. A portable communications terminal slidably openable and closable, comprising:
    a lower body;
    an upper body;
    a slide assembly including first and second slide plates coupled to the respective lower and upper bodies for common movement therewith, the first and second slide plates slidably coupled so as to allow the first slide plate and the lower body to be slidably moved relative to the second slide plate and the upper body for slidably opening and closing the portable communications terminal;
    a printed circuit board having one or more electronic components mounted thereon; and
    one or more EMI shielding walls attached to at least one surface of at least one of the first and second slide plates;
    whereby a corresponding portion of the at least one of the first and second slide plates that resides within a perimeter defined by the one or more EMI shielding walls is operable as an EMI shielding lid, such that the one or more EMI shielding walls and the corresponding portion of the at least one of the first and second slide plates are operable for cooperatively providing EMI shielding for the electronic components disposed within the interior cooperatively defined by the one or more EMI shielding walls, the corresponding portion of the at least one of the first and second slide plates, and the printed circuit board.

12. The portable communications terminal of claim 11, further comprising:
    a first user interface component coupled for common movement with the first slide plate; and
    a second user interface component coupled for common movement with the second slide plate.

13. The portable communications terminal of claim 11, further comprising at least one resilient finger extending generally outwardly from the one or more EMI shielding walls towards the printed circuit board, for electrically contacting at least one electrically conductive surface of the printed circuit board.

14. The portable communications terminal of claim 11, wherein:
    the one or more EMI shielding walls are welded directly to a surface of the second slide plate; and/or the one or more EMI shielding walls comprise one or more EMI shielding fingerstock gaskets; and/or the one or more EMI shielding walls comprise one or more EMI shielding fingerstock gaskets welded directly to a surface of the second slide plate.

15. The portable communications terminal of claim 11, wherein the one or more EMI shielding walls and the corresponding portion of the at least one of the first and second slide plates cooperatively define two or more EMI shielding compartments corresponding to the layout of the electronic components of the printed circuit board, such that the electronic components are in different EMI shielding compartments.

16. The portable communications terminal of claim 11, wherein the one or more EMI shielding walls are monolithically formed as a single component structure.

17. The portable communications terminal of claim 11, wherein the one or more EMI shielding walls include one or more spring fingers configured for contacting one or more electrically-conductive surfaces of the printed circuit board.

18. The portable communications terminal of claim 17, wherein the one or more spring fingers are formed from electrically-conductive material having sufficient resiliency for permitting the one or more spring fingers to be at least partially deflected and then to respond with a sufficient restorative force for biasing the one or more spring fingers against the one or more electrically-conductive surfaces of the printed circuit board, for maintaining good electrical contact with the one or more electrically-conductive surfaces of the printed circuit board.

* * * * *